US008692696B2

(12) United States Patent
Cideciyan et al.

(10) Patent No.: US 8,692,696 B2
(45) Date of Patent: Apr. 8, 2014

(54) GENERATING A CODE ALPHABET OF SYMBOLS TO GENERATE CODEWORDS FOR WORDS USED WITH A PROGRAM

(75) Inventors: Roy D. Cideciyan, Rueschlikon (CH); Glen A. Jaquette, Tucson, AZ (US); Thomas Mittelholzer, Rueschlikon (CH)

(73) Assignee: International Business Machines Corporation, Armonk, NY (US)

(*) Notice: Subject to any disclaimer, the term of this patent is extended or adjusted under 35 U.S.C. 154(b) by 44 days.

(21) Appl. No.: 13/342,899

(22) Filed: Jan. 3, 2012

(65) Prior Publication Data

US 2013/0169453 A1 Jul. 4, 2013

(51) Int. Cl.
*H03M 7/30* (2006.01)

(52) U.S. Cl.
USPC .................................. 341/87; 341/50; 341/51

(58) Field of Classification Search
USPC ............... 341/50, 51, 57, 59, 87, 67; 709/247
See application file for complete search history.

(56) References Cited

U.S. PATENT DOCUMENTS

| 4,725,815 | A | | 2/1988 | Mitchell et al. |
|---|---|---|---|---|
| 5,016,009 | A | | 5/1991 | Whiting et al. |
| 5,412,384 | A | | 5/1995 | Chang et al. |
| 5,534,861 | A | | 7/1996 | Chang et al. |
| 5,874,908 | A | | 2/1999 | Craft |
| 5,877,711 | A | | 3/1999 | Craft |
| 5,963,642 | A | * | 10/1999 | Goldstein ..................... 713/193 |
| 5,968,132 | A | * | 10/1999 | Tokunaga et al. ............. 709/247 |
| 5,974,144 | A | * | 10/1999 | Brandman .................... 380/216 |
| 6,218,970 | B1 | | 4/2001 | Jaquette |
| 7,003,111 | B2 | | 2/2006 | Jaquette |
| 7,215,259 | B2 | | 5/2007 | Kerber et al. |
| 7,623,047 | B2 | * | 11/2009 | Ordentlich et al. ............. 341/51 |
| 7,788,106 | B2 | | 8/2010 | Herre et al. |
| 2001/0029574 | A1 | | 10/2001 | Razdan et al. |

(Continued)

FOREIGN PATENT DOCUMENTS

EP 0 977 152 2/2000
EP 1578019 9/2005

(Continued)

OTHER PUBLICATIONS

Combined Search and Examination Report dated Nov. 15, 2012 for Application No. GB1212904.5.

(Continued)

*Primary Examiner* — Jean B Jeanglaude
(74) *Attorney, Agent, or Firm* — Konrad Raynes Davda & Victor LLP

(57) ABSTRACT

Provided are a computer program product, system, and method for generating a code alphabet for use by a deployed program to determine codewords for words. A first code alphabet is generated having a first number of symbols that provide variable length codings of the words. The symbols in the first code alphabet are merged into a second number of groups of the symbols in the first code alphabet, where the second number is less than the first number. A second code alphabet is generated having the second number of symbols, wherein a second average codeword length of the codewords produced using the symbols in the second code alphabet is smaller than the codeword length (b) of the words, and wherein the second code alphabet comprises the code alphabet used by the deployed program.

27 Claims, 13 Drawing Sheets

(56) References Cited

U.S. PATENT DOCUMENTS

| | | |
|---|---|---|
| 2002/0166022 A1 | 11/2002 | Suzuki |
| 2003/0105928 A1 | 6/2003 | Ash et al. |
| 2004/0210551 A1 | 10/2004 | Jones et al. |
| 2005/0073884 A1 | 4/2005 | Gonzalez et al. |
| 2005/0210151 A1 | 9/2005 | Abdo et al. |
| 2005/0257083 A1 | 11/2005 | Cousins |
| 2006/0235679 A1 | 10/2006 | Sperschneider et al. |
| 2006/0235683 A1 | 10/2006 | Sperschneider et al. |
| 2006/0235865 A1 | 10/2006 | Sperschneider et al. |
| 2009/0164455 A1 | 6/2009 | Weinberg et al. |
| 2010/0079311 A1 | 4/2010 | Sluiter |
| 2010/0191907 A1 | 7/2010 | Ish |
| 2011/0060598 A1 | 3/2011 | Sperschneider et al. |

FOREIGN PATENT DOCUMENTS

| | | |
|---|---|---|
| JP | 6309144 | 11/1994 |
| JP | 2008536182 | 9/2008 |
| JP | 2008536410 | 9/2008 |
| JP | 2008536411 | 9/2008 |
| WO | 2006108463 | 10/2006 |
| WO | 2006108464 | 10/2006 |

OTHER PUBLICATIONS

Notice of Allowance dated Nov. 9, 2012, pp. 1-18, for U.S. Appl. No. 13/188,401, filed Jul. 21, 2011 by inventor Glen A. Jaquette (18.394).

Notice of Allowance dated Nov. 26, 2012, pp. 1-16, for U.S. Appl. No. 13/188,405, filed Jul. 21, 2011 by inventor Glen A. Jaquette (18.395).

"Technique to Generate very Efficient Compression/Decompression Engines for XML Data Streams Based on the Stream's DTD", IP.com, Published Feb. 1, 2000, pp. 1-3.

J. Jo et al., "Fast Construction of Suffix Arrays for DNA Strings", Journal of Korean Information Science Society: Computer Systems and Theory, vol. 34, No. 7-8, pp. 319-326, Aug. 2007.

Y.E. Yang, et al., "Memory-Efficient Pipelined Architecture for Large-Scale String Matching", US National Science Foundation, Grant CCR-0702784, Apr. 2009, pp. 1-8.

P. Deutsch, "DEFLATE Compress Data Format Specification version 1.3", Alladdin Enterprises, May 1996, pp. 1-15.

"Streaming Lossless Data Compression Algorithm—(SLDC)", ECMA Standardizing Information and Communication Systems, Standard ECMA-321, Jun. 2001, pp. 1-20.

"DEFLATE", Wikipedia, [online], [retrieved Mar. 25, 2011], pp. 1-6, http://en.wikipedia.org/w/index.php?title=DEFLATE &printable=yespp.

"Huffman Coding", Wikipedia, [online], [retrieved Apr. 3, 2011], pp. 1-11, http://en.wikipedia.org/w/index.php?title= Huffman_coding &printable=yes.

U.S. Appl. No. 13/188,401, filed Jul. 21, 2011 by inventor Glen A. Jaquette (18.394).

U.S. Appl. No. 13/188,405, filed Jul. 21, 2011 by inventor Glen A. Jaquette (18.395).

U.S. Appl. No. 13/761,114, filed Feb. 6, 2013 by inventor Glen A. Jaquette.

U.S. Appl. No. 13/766,762, filed Feb. 13, 2013 by inventor Glen A. Jaquette.

Response dated Jan. 30, 2013 to Combined Search and Examination Report dated Nov. 15, 2012 for Application No. GB1212904.5.

International Search Report & Written Opinion dated Apr. 16, 2013, for Serial No. PCT/IB2012/057449, filed Dec. 19, 2012.

U.S. Appl. No. 13/779,309, filed Feb. 27, 2013.

Office Action dated Sep. 5, 2013, pp. 33, for U.S. Appl. No. 13/779,309, filed Feb. 27, 2013.

\* cited by examiner

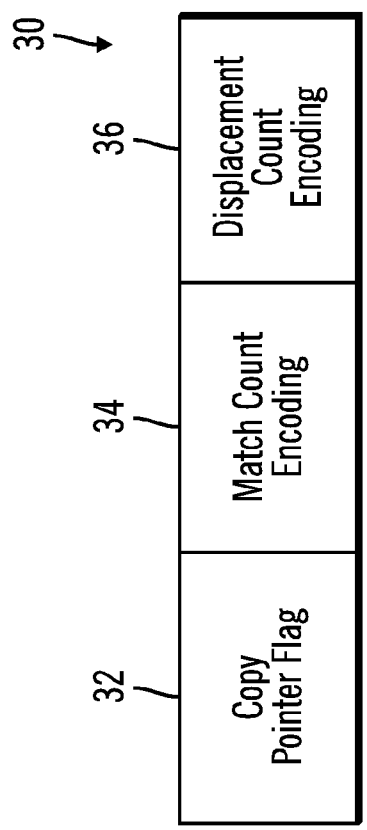

FIG. 2 Copy Pointer Symbol

| | | |
|---|---|---|
| Copy Pointer Flag | Match Count Encoding | Displacement Count Encoding |

32, 34, 36, 30

FIG. 3 Displacement Count Variable Length Code Table for 16KB History Buffer

| Huffman Encoding: (total bits) | Relative Displacement Count | Relative Displacement Count start | Relative Displacement Count end |
|---|---|---|---|
| 0.0.0. <8 bits> (11) | Most recent 256 | 0 | 255 |
| 0.0.10. <8 bits> (12) | 256 before that | 256 | 511 |
| 0.0.11. <9 bits> (13) | 512 before that | 512 | 1023 |
| 0.10. <10 bits> (13) | 1024 before that | 1024 | 2047 |
| 0.11. <11 bits> (14) | 2048 before that | 2048 | 4095 |
| 10. <12 bits> (14) | 4096 before that | 4096 | 8191 |
| 11. <13 bits> (15) | 8192 before that | 8192 | 16383 |

52, 54, 56, 58, 60, 62, 64, 50

Generate a second code alphabet frequency distribution of frequencies of the merged second number of groups (M2) of the symbols in the first code alphabet, wherein the frequency of each of the merged second number of groups comprises a sum of the frequencies of the words assigned to the first code alphabet symbols merged into the group. —114

Generate a second code alphabet having the second number (M2) of symbols defined by the second code distribution, wherein each symbol in the second code alphabet maps to the words in one of the second number of groups and has a frequency of the group of words to which the symbol maps, wherein a second average codeword length of the codewords produced using the symbols in the second code alphabet is smaller than the codeword length (b) of the N displacement values. —116

FIG. 4B

Initiate operation to merge symbols in the second number of groups (M2). —120

Form at least one group of $2^n$ consecutive code alphabet symbols of equal length, where n for each group of $2^n$ consecutive code alphabet symbols of one length is any non-negative integer value, and wherein smallest values for n are used before larger values. —122

FIG. 5

Initiate operation to merge symbols in the second number of groups (M2). —130

Form each group to have consecutive symbols in the first code alphabet, wherein at least one of groups of symbols from the first code alphabet comprises at least two of the consecutive symbols in the first code alphabet having a different length, and wherein groups of $2^n$ symbols are formed, starting from 0 to a value until all the first code alphabet symbols are formed in groups of $2^n$ symbols. —132

FIG. 6

| Huffman Code (total bits) | | Relative Displacement |
|---|---|---|
| 011 <7 bit> | (10) | 1:128 |
| 0011 <7 bit> | (11) | 129:256 |
| 00000 <7 bit> | (12) | 257:384 |
| 100 <9 bit> | (12) | 385:896 |
| 00011 <8 bit> | (13) | 897:1152 |
| 101 <10 bit> | (13) | 1153:2176 |
| 0000100 <7 bit> | (14) | 2177:2304 |
| 001010 <8 bit> | (14) | 2305:2560 |
| 0100 <10 bit> | (14) | 2561:3584 |
| 110 <11 bit> | (14) | 3585:5632 |
| 0000101 <8 bit> | (15) | 5633:5888 |
| 000011 <9 bit> | (15) | 5889:6400 |
| 00100 <10 bit> | (15) | 6401:7424 |
| 0101 <11 bit> | (15) | 7425:9472 |
| 111 <12 bit> | (15) | 9473:13568 |
| 0010110 <9 bit> | (16) | 13569:14080 |
| 0010111 <8 bit> | (15) | 14081:14336 |
| 00010 <11 bit> | (16) | 14337:16384 |

| | | |
|---|---|---|
| '1 0 0' | '0 0 0 1 0 0 0' | '1 1 1 1 1 0 0 1' |
| | '0 0 0 1 0 0 1 0' | '1 1 1 1 1 0 0 0' |
| '0 1 0 0' | '0 0 0 0 1 1 1 1' | '1 1 1 1 1 1 0 1' |
| | '0 0 0 1 0 0 1 1' | '1 1 1 1 1 1 0 0' |
| '0 0 0 0 0' | '0 0 0 1 0 1 0 0' | '0 0 0 0 1 1 0 1 0' |
| | '0 0 1 0 0 0 0 1' | '0 0 0 0 1 1 1 0 1' |
| '0 0 1 1 0' | '0 0 0 1 1 1 1 1' | |
| '0 1 1 1 1' | '0 0 1 0 1 1 0 0' | '0 0 0 0 1 0 0 0 0' |
| '1 1 0 0 0' | '0 0 1 0 0 1 1 1' | '0 0 0 0 1 1 0 1 1' |
| '1 1 1 1 0' | '0 0 1 0 1 1 0 1' | '1 1 1 1 1 1 1 1' |
| | '0 0 1 1 1 0 0 1' | '1 1 1 1 1 1 1 0' |
| '0 0 0 1 1 0' | '0 0 1 1 1 1 0 0' | |
| '0 0 1 0 1 0' | '0 0 1 1 1 0 0 0' | |
| | '0 0 1 1 1 1 0 1' | '0 0 0 1 0 0 0 1 0' |
| '0 1 0 1 0 0' | '0 1 0 1 0 1 1 0' | '0 0 0 0 1 0 0 0 1' |
| '0 1 0 1 1 1' | '0 1 0 1 0 1 1 1' | '0 0 0 1 1 1 1 0 0' |
| '0 1 1 0 1 0' | '0 1 0 1 1 0 0 0' | '0 0 0 1 0 1 0 1 0' |
| '1 0 1 0 1 0' | '0 1 1 0 0 1 0 0' | '0 0 0 0 1 1 1 0 0' |
| '1 0 1 1 0 0' | '0 1 0 1 1 0 0 1' | '0 0 0 1 0 0 0 1 1' |
| '1 1 0 1 0 0' | '0 1 0 1 1 0 1 0' | '0 0 0 1 1 1 0 1 0' |
| '1 1 0 1 1 1' | '0 1 0 1 1 0 1 1' | '0 0 0 1 1 1 0 1 1' |
| '1 1 1 0 1 1' | '0 1 1 0 0 1 0 1' | '0 0 0 1 1 1 0 0 0' |
| | '0 1 1 1 0 0 1 0' | '0 0 1 0 0 0 0 0 1' |
| '0 0 0 0 1 0 1' | '0 1 1 0 0 1 1 0' | '0 0 1 0 0 1 1 0 1' |
| | '0 1 1 0 0 1 1 1' | '0 0 1 0 0 1 1 0 0' |
| '0 0 0 1 0 1 1' | '0 1 1 1 0 1 0 0' | '0 0 0 1 1 1 0 0 1' |
| '0 0 1 0 0 1 0' | '0 1 1 1 0 0 1 1' | '0 0 1 0 0 0 0 0 0' |
| | '1 0 1 0 0 0 1 0' | '0 0 0 1 0 1 0 1 1' |
| '0 0 1 0 0 0 1' | '0 1 1 1 0 1 0 1' | '0 0 0 1 1 1 1 0 1' |
| '0 0 1 0 1 1 1' | '1 0 1 0 0 0 0 0' | |
| '0 0 1 1 1 0 1' | '1 0 1 0 0 0 1 1' | |
| '0 0 1 1 1 1 1' | '1 0 1 0 0 0 0 1' | |
| '0 1 0 1 0 1 0' | '1 0 1 1 0 1 0 1' | |
| '0 1 1 0 0 0 0' | '1 0 1 0 0 1 1 0' | |
| '0 1 1 0 0 0 1' | '1 0 1 1 0 1 0 0' | |
| '0 1 1 1 0 0 0' | '1 0 1 0 0 1 1 1' | |
| | '1 0 1 1 0 1 1 1' | |
| '0 1 1 0 1 1 0' | '1 0 1 1 1 0 1 0' | |
| '0 1 1 0 1 1 1' | '1 0 1 1 1 1 0 1' | FIG. 13 |
| '0 1 1 1 0 1 1' | '1 0 1 1 1 0 1 1' | |
| '1 0 1 0 0 1 0' | '1 1 0 0 1 1 0 0' | |
| '1 0 1 0 1 1 0' | '1 0 1 1 0 1 1 0' | |
| '1 0 1 0 1 1 1' | '1 1 0 1 0 1 1 1' | |
| '1 0 1 1 1 1 1' | '1 0 1 1 1 1 0 0' | |
| '1 0 1 1 1 0 0' | '1 1 0 1 0 1 0 0' | |
| '1 1 0 0 1 0 1' | '1 1 0 1 0 1 1 0' | |
| '1 1 0 0 1 0 0' | '1 1 0 0 1 1 1 0' | |
| '1 1 0 1 1 0 0' | '1 1 1 0 1 0 0 0' | |
| '1 1 1 0 0 0 0' | '1 1 0 1 0 1 0 1' | |
| '1 1 0 1 1 0 1' | '1 1 1 0 0 0 1 1' | |
| '1 1 1 1 1 0 1' | '1 1 0 0 1 1 1 1' | |
| '1 1 1 0 0 1 1' | '1 1 0 0 1 1 0 1' | |
| '1 1 1 0 1 0 1' | '1 1 1 0 0 0 1 0' | |
| | '1 1 1 0 0 1 0 0' | |
| '0 0 0 0 1 0 0 1' | '1 1 1 0 0 1 0 1' | |
| '0 0 0 0 1 1 0 0' | '1 1 1 0 1 0 0 1' | |

$$\begin{bmatrix}
\begin{array}{ll}
\text{'1 0 0'} & 1 \\
\hline
\text{'0 1 0 0'} & 2 \\
\hline
\text{'0 0 0 0 0'} & 3 \\
\hline
\text{'0 0 1 1 0'} & \\
\text{'0 1 1 1 1'} & \\
\text{'1 1 0 0 0'} & \\
\text{'1 1 1 1 0'} & 4 \\
\hline
\text{'0 0 0 1 1 0'} & \\
\text{'0 0 1 0 1 0'} & 5 \\
\hline
\text{'0 1 0 1 0 0'} & \\
\text{'0 1 0 1 1 1'} & \\
\text{'0 1 1 0 1 0'} & \\
\text{'1 0 1 0 1 0'} & \\
\text{'1 0 1 1 0 0'} & \\
\text{'1 1 0 1 0 0'} & \\
\text{'1 1 0 1 1 1'} & \\
\text{'1 1 1 0 1 1'} & 6 \\
\hline
\text{'0 0 0 0 1 0 1'} & 7 \\
\hline
\text{'0 0 0 1 0 1 1'} & \\
\text{'0 0 1 0 0 1 0'} & 8 \\
\hline
\text{'0 0 1 0 0 0 1'} & \\
\text{'0 0 1 0 1 1 1'} & \\
\text{'0 0 1 1 1 0 1'} & \\
\text{'0 0 1 1 1 1 1'} & \\
\text{'0 1 0 1 0 1 0'} & \\
\text{'0 1 1 0 0 0 0'} & \\
\text{'0 1 1 0 0 0 1'} & \\
\text{'0 1 1 1 0 0 0'} & 9 \\
\hline
\text{'0 1 1 0 1 1 0'} & \\
\text{'0 1 1 0 1 1 1'} & \\
\text{'0 1 1 1 0 1 1'} & \\
\text{'1 0 1 0 0 1 0'} & \\
\text{'1 0 1 0 1 1 0'} & \\
\text{'1 0 1 0 1 1 1'} & \\
\text{'1 0 1 1 1 1 1'} & \\
\text{'1 0 1 1 1 0 0'} & \\
\text{'1 1 0 0 1 0 1'} & \\
\text{'1 1 0 0 1 0 0'} & \\
\text{'1 1 0 1 1 0 0'} & \\
\text{'1 1 1 0 0 0 0'} & \\
\text{'1 1 0 1 1 0 1'} & \\
\text{'1 1 1 1 1 0 1'} & \\
\text{'1 1 1 0 0 1 1'} & \\
\end{array}
&
\begin{array}{ll}
\text{'1 1 1 0 1 0 1'} & 10 \\
\hline
\text{'0 0 0 0 1 0 0 1'} & \\
\text{'0 0 0 0 1 1 0 0'} & \\
\text{'0 0 0 1 0 0 0 0'} & \\
\text{'0 0 0 1 0 0 1 0'} & \\
\text{'0 0 0 0 1 1 1 1'} & \\
\text{'0 0 0 1 0 0 1 1'} & \\
\text{'0 0 0 1 0 1 0 0'} & \\
\text{'0 0 1 0 0 0 0 1'} & \\
\text{'0 0 0 1 1 1 1 1'} & \\
\text{'0 0 1 0 1 1 0 0'} & \\
\text{'0 0 1 0 0 1 1 1'} & \\
\text{'0 0 1 0 1 1 0 1'} & \\
\text{'0 0 1 1 1 0 0 1'} & \\
\text{'0 0 1 1 1 1 0 0'} & \\
\text{'0 0 1 1 1 0 0 0'} & \\
\text{'0 0 1 1 1 1 0 1'} & \\
\text{'0 1 0 1 0 1 1 0'} & \\
\text{'0 1 0 1 0 1 1 1'} & \\
\text{'0 1 0 1 1 0 0 0'} & \\
\text{'0 1 1 0 0 1 0 0'} & \\
\text{'0 1 0 1 1 0 0 1'} & \\
\text{'0 1 0 1 1 0 1 0'} & \\
\text{'0 1 0 1 1 0 1 1'} & \\
\text{'0 1 1 0 0 1 0 1'} & \\
\text{'0 1 1 1 0 0 1 0'} & \\
\text{'0 1 1 0 0 1 1 0'} & \\
\text{'0 1 1 0 0 1 1 1'} & \\
\text{'0 1 1 1 0 1 0 0'} & \\
\text{'0 1 1 1 0 0 1 1'} & \\
\text{'1 0 1 0 0 0 1 0'} & \\
\text{'0 1 1 1 0 1 0 1'} & \\
\text{'1 0 1 0 0 0 0 0'} & \\
\text{'1 0 1 0 0 0 1 1'} & \\
\text{'1 0 1 0 0 0 0 1'} & \\
\text{'1 0 1 1 0 1 0 1'} & \\
\text{'1 0 1 0 0 1 1 0'} & \\
\text{'1 0 1 1 0 1 0 0'} & \\
\text{'1 0 1 0 0 1 1 1'} & \\
\text{'1 0 1 1 0 1 1 1'} & \\
\text{'1 0 1 1 1 0 1 0'} & \\
\text{'1 0 1 1 1 1 0 1'} & \\
\text{'1 0 1 1 1 0 1 1'} & \\
\text{'1 1 0 0 1 1 0 0'} & \\
\text{'1 0 1 1 0 1 1 0'} & \\
\text{'1 1 0 1 0 1 1 1'} & \\
\text{'1 0 1 1 1 1 0 0'} & \\
\text{'1 1 0 1 0 1 0 0'} & \\
\text{'1 1 0 1 0 1 1 0'} & \\
\text{'1 1 0 0 1 1 1 0'} & \\
\text{'1 1 1 0 1 0 0 0'} & \\
\end{array}
&
\begin{array}{ll}
\text{'1 1 0 1 0 1 0 1'} & \\
\text{'1 1 1 0 0 0 1 1'} & \\
\text{'1 1 0 0 1 1 1 1'} & \\
\text{'1 1 0 0 1 1 0 1'} & \\
\text{'1 1 1 0 0 0 1 0'} & \\
\text{'1 1 1 0 0 1 0 0'} & \\
\text{'1 1 1 0 0 1 0 1'} & \\
\text{'1 1 1 0 1 0 0 1'} & \\
\text{'1 1 1 1 1 0 0 1'} & \\
\text{'1 1 1 1 1 0 0 0'} & \\
\text{'1 1 1 1 1 1 0 1'} & \\
\text{'1 1 1 1 1 1 0 0'} & \\
\text{'0 0 0 0 1 1 0 1 0'} & \\
\text{'0 0 0 0 1 1 1 0 1'} & 11 \\
\hline
\text{'0 0 0 0 1 0 0 0 0'} & \\
\text{'0 0 0 0 1 1 0 1 1'} & \\
\text{'1 1 1 1 1 1 1 1'} & \\
\text{'1 1 1 1 1 1 1 0'} & 12 \\
\hline
\text{'0 0 0 1 0 0 0 1 0'} & \\
\text{'0 0 0 0 1 0 0 0 1'} & \\
\text{'0 0 0 1 1 1 1 0 0'} & \\
\text{'0 0 0 1 0 1 0 1 0'} & \\
\text{'0 0 0 0 1 1 1 0 0'} & \\
\text{'0 0 0 1 0 0 0 1 1'} & \\
\text{'0 0 0 1 1 1 0 1 0'} & \\
\text{'0 0 0 1 1 1 0 1 1'} & \\
\text{'0 0 0 1 1 1 0 0 0'} & \\
\text{'0 0 1 0 0 0 0 0 1'} & \\
\text{'0 0 1 0 0 1 1 0 1'} & \\
\text{'0 0 1 0 0 1 1 0 0'} & \\
\text{'0 0 0 1 1 1 0 0 1'} & \\
\text{'0 0 1 0 0 0 0 0 0'} & \\
\text{'0 0 0 1 0 1 0 1 1'} & \\
\text{'0 0 0 1 1 1 1 0 1'} & 13 \\
\end{array}
\end{bmatrix}$$

FIG. 14

GENERATING A CODE ALPHABET OF SYMBOLS TO GENERATE CODEWORDS FOR WORDS USED WITH A PROGRAM

BACKGROUND OF THE INVENTION

1. Field of the Invention

The present invention relates to a computer program product, system, method, and data structure for generating a code alphabet of symbols to generate codewords for words used with a program.

2. Description of the Related Art

Data compression involves converting symbols, including data symbols and control symbols, in an input data stream into a compressed output data stream comprising less data than the input data stream. Control symbols are encoded into the compressed data stream and provide decoding instructions to allow decompression, and may be created by the application program which is compressing data. Examples of control symbols created by the application include an end of record control signal, a file mark, and a dataset boundary. There are other events or controls determined by the compression device, such as when to swap to a given compression scheme, and when to reset the history buffer used to perform compression in a given scheme. The compressing device may decide to create an access point at which compression begins with a reset history buffer using a particular scheme after a dataset boundary is encountered.

One type of encoding technique, Huffman coding, provides a lossless compression algorithm that uses a variable length code table of symbols for encoding source symbols where the variable length code table has been derived based on the estimated probability of occurrence for each possible source symbol value to produce encodings of the source symbols.

A streaming lossless data compression algorithm (SLDC) receives an input data stream of control symbols and data symbols and converts strings of consecutive bytes of data symbols into copy pointers and literal data symbols that have fewer bits than the data symbols in the input data stream. The SLDC algorithm is used to compress and decompress data in Linear Tape Open (LTO) magnetic tape cartridges. Details of the SLDC algorithm are described in the Standard ECMA-321 publication "Streaming Lossless Data Compression Algorithm—(SLDC), dated Jun. 1, 2001.

The SLDC algorithm outputs a literal data symbol into the compressed data stream if there are no consecutive bytes following a data byte in the history buffer, so that the literal data byte is outputted, uncompressed. The SLDC algorithm outputs a copy pointer symbol into the output data stream to represent multiple consecutive data bytes that match a same number of consecutive data bytes in the history buffer. The copy pointer symbol includes one bit indicating that the symbol is a copy pointer, a match count field indicating the number of matching consecutive bytes, and a displacement field indicating an absolute memory address having the history buffer entry including the first byte of the matching consecutive bytes.

There is a need in the art to provide techniques for producing code alphabets of symbols used to represent words values in a program, including, but not limited to, compression programs.

SUMMARY

Provided are a computer program product, system, and method for generating a code alphabet for use by a deployed program to determine codewords for words having a length of b bits used in a computing system, wherein the codewords have an average codeword length less than b. A first code alphabet is generated having a first number of symbols that provide variable length codings of the words, wherein a first average codeword length of the codewords produced using the symbols in the first code alphabet is smaller than the codeword length (b) of the words. The symbols in the first code alphabet are merged into a second number of groups of the symbols in the first code alphabet, where the second number is less than the first number. A second code alphabet is generated having the second number of symbols, wherein a second average codeword length of the codewords produced using the symbols in the second code alphabet is smaller than the codeword length (b) of the words, and wherein the second code alphabet comprises the code alphabet used by the deployed program.

BRIEF DESCRIPTION OF THE DRAWINGS

FIG. 2 illustrates a prior art implementation of a copy pointer symbol.

FIG. 3 illustrates an embodiment of a displacement count variable length code table.

FIGS. 4a and 4b illustrate an embodiment of operations to produce a first code alphabet and a second code alphabet.

FIGS. 5 and 6 illustrate embodiments of operations to merge symbols from a first code alphabet to use to generate a second code alphabet.

FIG. 10 illustrates an example of a Huffman encoding of relative displacement values in a history buffer occurring during compression operations.

FIGS. 11 and 13 illustrate examples of symbols from a first code alphabet by selecting 128 values to merge based on the distribution in FIG. 7.

FIGS. 12 and 14 illustrate an example of grouping consecutive symbols from the symbols in FIGS. 11 and 13, respectively, into 18 groups to form a second code alphabet having fewer symbols than the first code alphabet of FIGS. 11 and 13, respectively.

DETAILED DESCRIPTION

Described embodiments provide techniques to generate a first code alphabet of symbols from a word frequency distribution, where the symbols map to a set of words and wherein the codewords produced by the symbols in the first code alphabet have an average codeword length less than the length of the set of words. Symbols from the first code alphabet are merged into groups to form a second code alphabet having a symbol for each of the groups of merged symbols from the first code alphabet. The second code alphabet has fewer symbols than the first code alphabet, and an average codeword length less than the length of the words in the set. In this way, the second code alphabet is easier to implement and use than the first code alphabet because it has fewer symbols, but has an average codeword length substantially similar to that of the first code alphabet, so as to provide fewer symbols with no loss in compression.

Figure 1:
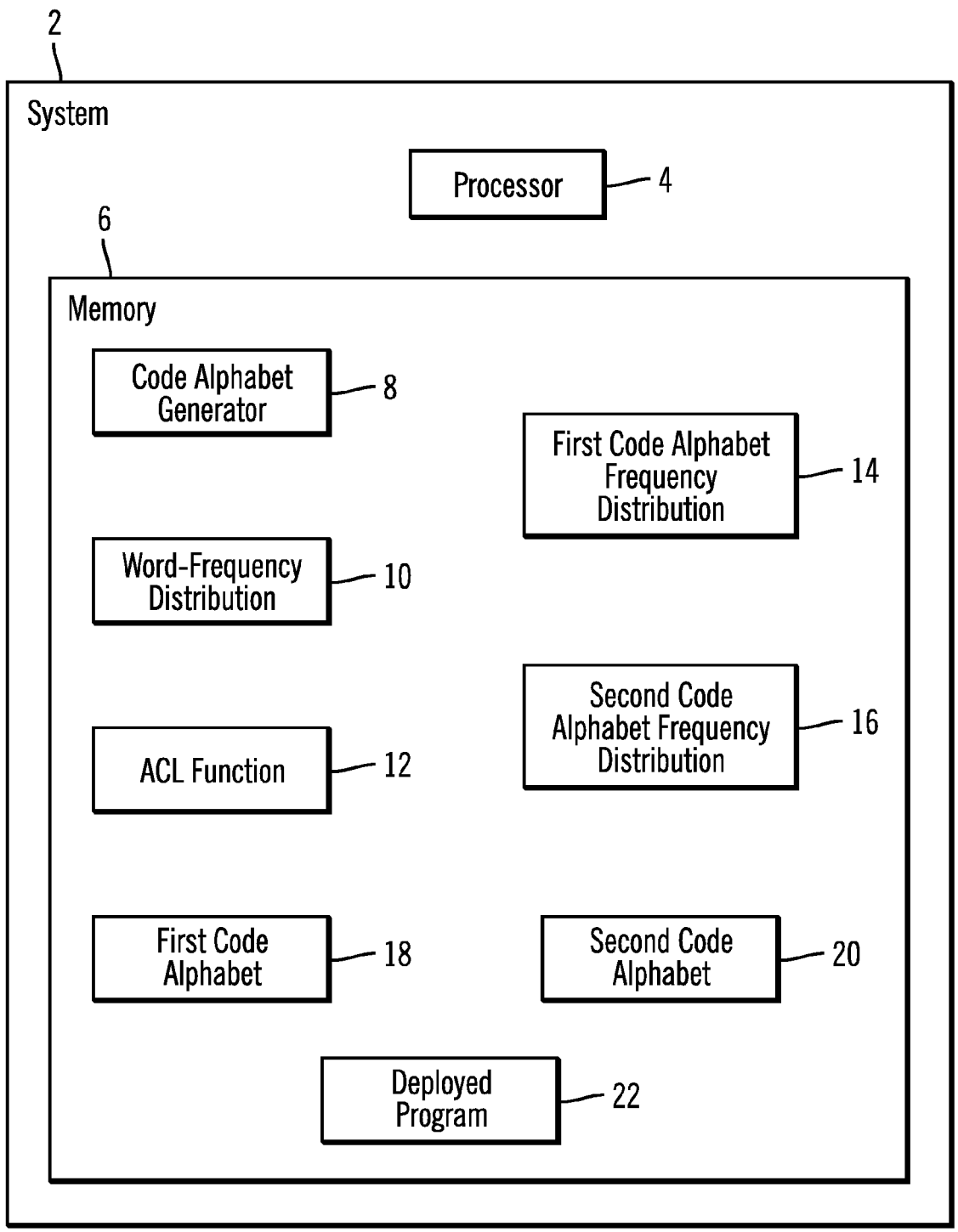
FIG. 1 illustrates an embodiment of a computing environment.

FIG. 1 provides an embodiment of a computing environment to generate a code alphabet to use in a program to generate codewords for words used by the program, where the generated codewords have an average length less than the length of the words. A system 2 includes a processor 4 and a memory 6. The memory 6 includes a code alphabet generator 8 to generate a code alphabet for a set of N words having length b. The code alphabet generator 8 processes a word-frequency distribution 10, an average codeword length (ACL) function 12, a first code alphabet frequency distribution 14, and a second code alphabet frequency distribution 16 to use when generating a first code alphabet 18 and a second code alphabet 20. The second code alphabet provides a mapping of symbols to the N possible words to generate codewords having an average codeword length less than the word length b. The second code alphabet 20 may be included in a deployed program 22, where the deployed program 22 uses the second code alphabet 20 to generate codewords to use for one of the N words being selected for use by the program 22.

In one embodiment, the deployed program 22 may comprise a compression program, such as an SLDC program, that processes an input data stream to compress into an output data stream. In compression techniques, such as with SLDC, a plurality of bytes in the input data stream can be replaced by a copy pointer indicating a location in a history buffer where a plurality of bytes start matching a plurality of bytes in the input data stream. The history buffer stores incoming data units for compression and decompression, where during compression, input data units are replaced by a copy pointer that references consecutive previously processed data units (e.g. bytes) in the history buffer.

FIG. 2 provides an embodiment of a copy pointer symbol 30 having a copy pointer flag 32, such as a bit having a value of 1, identifying the symbol 30 as a copy pointer, a match count encoding 34 comprising an encoding of a number of data units (e.g. bytes) in the input data stream replaced by the copy pointer 30 in the output data stream, and a displacement count encoding 36 comprising an encoding of a relative location in the history buffer at which the consecutive data units start. The fields shown in FIG. 2 may be output in a different order than shown. The displacement count encoding 36 may be determined from the second code alphabet 20.

FIG. 3 illustrates an example of a Huffman coded table 50 providing an implementation of the second code alphabet 20 when the history buffer is 16 kilobytes (KB). The codings from the table 50 are included in the displacement count encoding 36 of the copy pointer indicating one of the $2^{14}$ locations in the history buffer where the matching bytes are located. Table 50 provides different encodings of the relative displacement count into the history buffer for different ranges of displacement counts. In table 50, entry 52 has a first prefix value of 3 bits which indicates that a next following 8 bits indicates a relative displacement count of 0 through 255 in the history buffer; entry 54 has a second prefix value of four bits which indicates that a next following 8 bits indicates a relative displacement count of 256 through 511 in the history buffer; entry 56 has a third prefix value of four bits which indicates that a next following 9 bits indicates a relative displacement count of 512 through 1023 in the history buffer; entry 58 has a fourth prefix value of three bits which indicates that a next following 10 bits indicates a relative displacement count of 1024 through 2047 in the history buffer; entry 60 has a fifth prefix value of three bits which indicates that a next following 11 bits indicates a relative displacement count of 2048 through 4095 in the history buffer; entry 62 has a sixth prefix value of two bits which indicates that a next following 12 bits indicates a relative displacement count of 4096 through 8191 in the history buffer; and entry 64 has a seventh prefix value of 2 bits which indicates that a next following 13 bits indicates a relative displacement count of 8192 through 16383 in the history buffer.

Figure 4A:
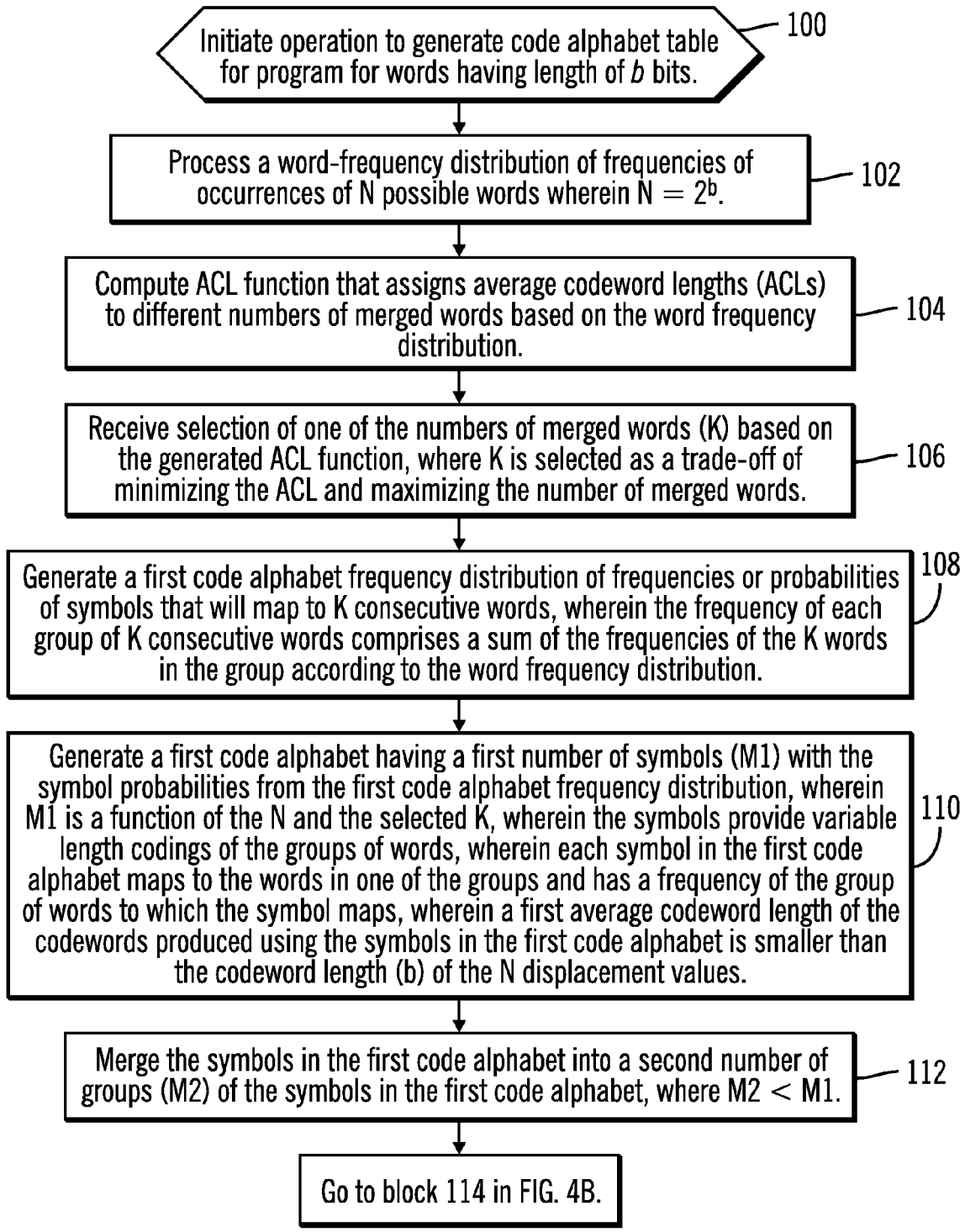

FIGS. 4a and 4b illustrate an embodiment of operations performed by the code alphabet generator 8 to generate the second code alphabet 20 to be included in the deployed program 22. Upon initiating (at block 100) an operation to generate a code alphabet table for a program 22 for words used in the program 22 having a length of b bits, the code alphabet generator 8, processes (at block 102) the word-frequency distribution 10 of the N possible words, where $N=2^b$. The word frequency distribution 10 may comprise pairs (i, $f_i^0$), where i=1, 2, ..., N and the frequency for the ith word is $f_i^0$. Probability values $p_i^0$ can be computed from the frequencies $f_i^0$ from the word frequency distribution 10 according to the below equation (1):

$$p_i^0 = \frac{f_i^0}{F} \text{ where } F = \sum_{i=1}^{N} f_i^0 \quad (1)$$

The frequencies $f_i^0$ may be calculated by measured occurrences of the ith word during program 22 operations. In one embodiment, the word-frequency distribution 10 may be such that lower word values are more frequently used by the program 22 than higher value words. The word frequency distribution 10 may be generated during manufacturing to generate the second code alphabet 18 to include in the deployed program 22 that will be distributed for use. Alternatively, the distribution 10 and other operations of FIGS. 4a and 4b may be performed in a program deployed at customer sites to provide real-time generation of the code alphabets to use with the program 22.

Figure 7:
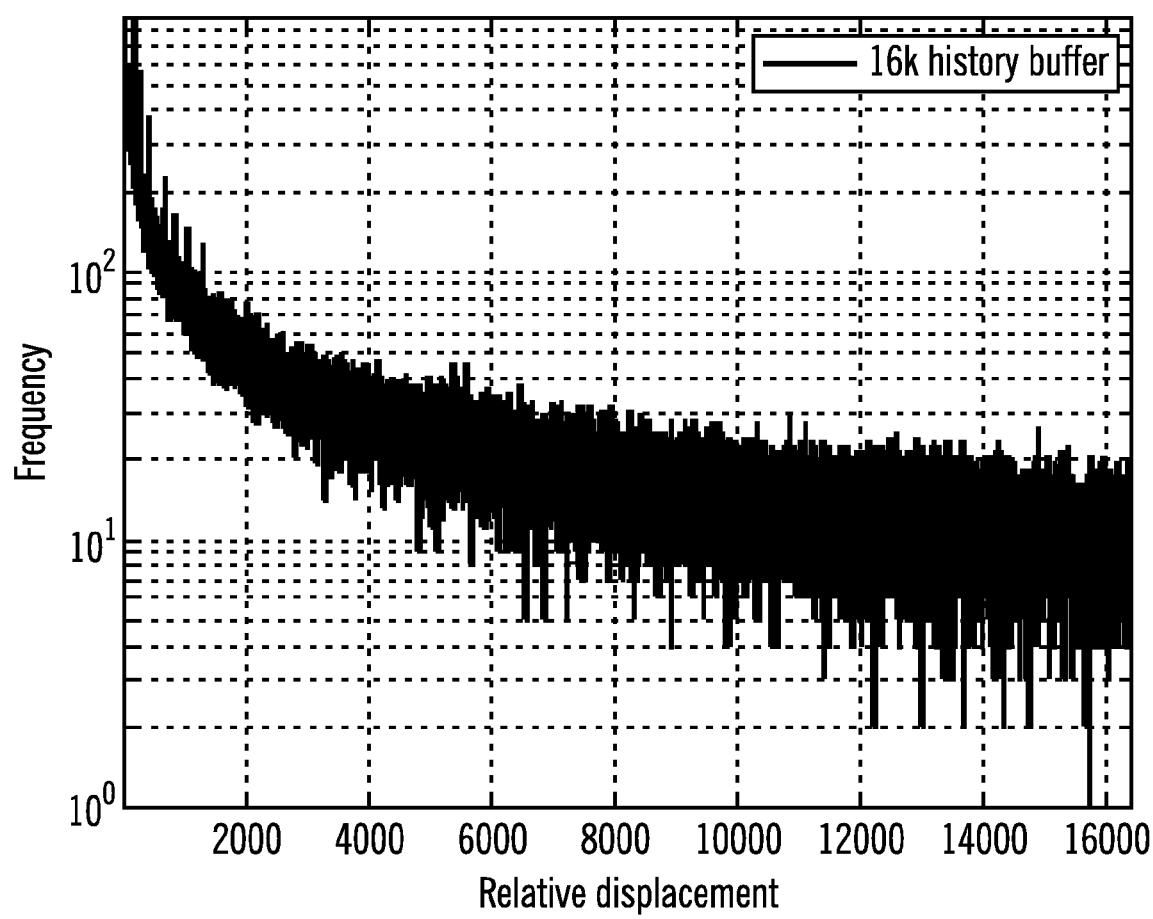
FIG. 7 illustrates an example of a distribution of a frequency of the occurrence of $2^{14}$ relative displacement count values.

FIG. 7 illustrates an example of a word frequency distribution 10 of the occurrence of relative displacement counts used in copy pointers 30 (FIG. 2) in a compressed output data stream during compression operations to indicate locations in the history buffer having consecutive bytes matching consecutive bytes in the input data stream. In FIG. 7, lower value words representing earlier locations in the history buffer, i.e., smaller displacement values, more frequently have matching strings than higher value words representing later locations in the history buffer, or greater displacement values in the history buffer.

Figures 8A, 8B:
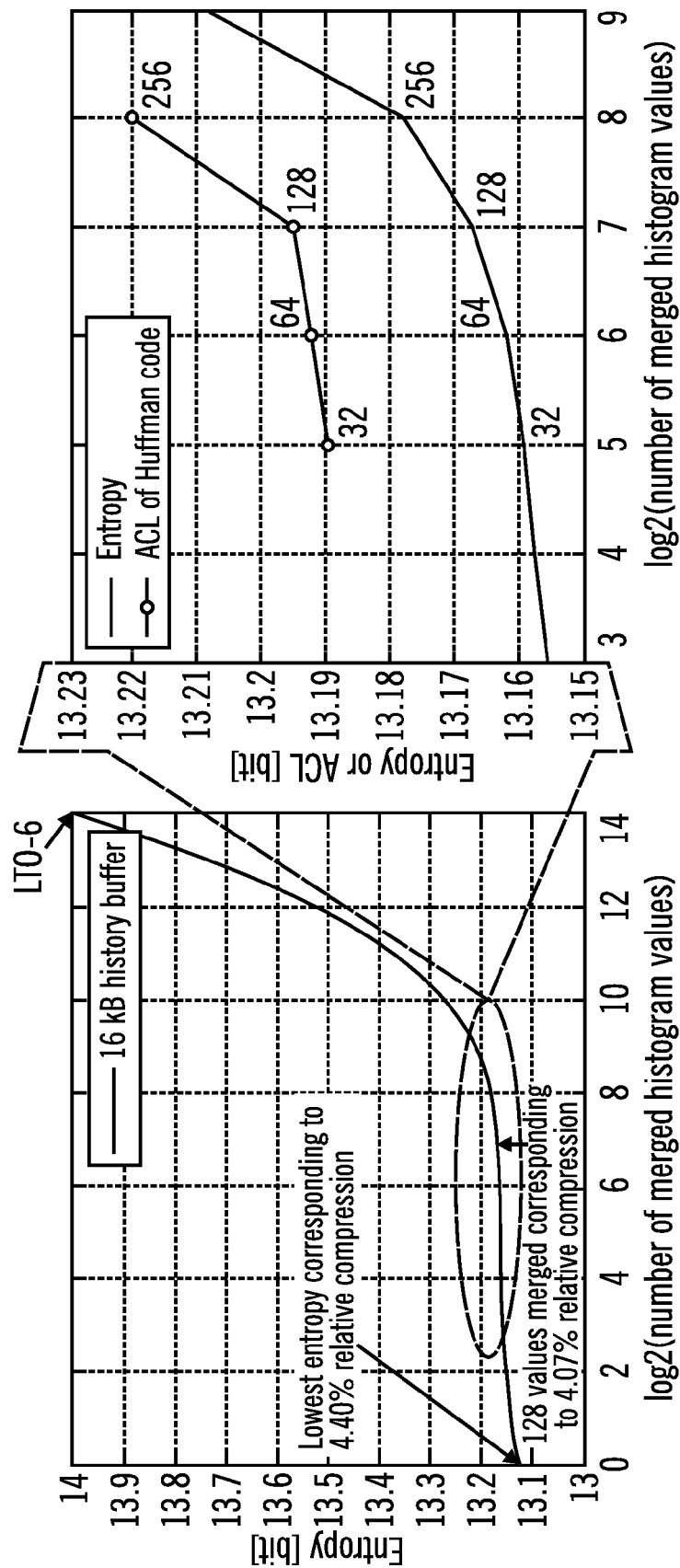
FIGS. 8a and 8b illustrate entropy and average codeword length (ACL) values for different Huffman encodings using different numbers of merged relative displacement count values.

The code alphabet generator 8 computes (at block 104) the ACL function 12. This ACL function 12 assigns average codeword lengths (ACLs) of code alphabet symbols to different numbers of merged or grouped words, based on the word frequency distribution 10. FIGS. 8a and 8b show that as the number of merged words increases, i.e., number of words that map to each symbol increases or number of symbols decreases, the entropy or average codeword length increases, approaching the number of bits. The ACL function 12 shown in FIGS. 8a and 8b compares average code word length to the $\log_2$ of the number of merged/grouped words. In alternative embodiments, K could have been chosen as the x-axis value in FIG. 8b instead of $\log_2(K)$.

In Huffman coding implementations, the average code word length values for different numbers of merged or grouped words for a symbol, expressed as K, may be calculated using an entropy equation, such as the entropy equation (2) below:

$$-\sum_{i=1}^{M_1}\sum_{j=1}^{K}\left(\frac{p_i^1}{K}\log_2\left(\frac{p_i^1}{K}\right)\right) = \quad (2)$$

$$-\sum_{i=1}^{M_1} p_i^1 (\log_2 p_i^1 - \log_2 K) = \log_2 K + \log_2 M_1 - \frac{1}{M_1}\sum_{i=1}^{M_1} f_i^1 \log_2 f_i^1$$

The term $\log_2 K$ in the above entropy equation (2) formula stands for the number of bits needed to represent the K words that have been merged to group for one symbol in the alphabet. The variable $M_1$ equals N/K, which indicates the number of symbols in the first code alphabet 18 to which the N words map. The probability $p_i^1$ expresses the probability of the occurrence of the K words mapping to the ith symbol, where $f_i^1$ is the frequency of the occurrence of the K words that map to the ith symbol in the first code alphabet 18. The probability of the occurrences ($p_i^1$) of different symbols in the first code alphabet calculated according to equation (2) below:

$$p_i^1 = \frac{f_i^1}{F} = \sum_{j=(i-1)K+1}^{iK} p_j^0, \text{ where } p_i^0 = \frac{f_i^0}{F} \text{ and } F = \sum_{i=1}^{N} f_i^0 \quad (3)$$

The $M_1$ or number of symbols for a Huffman coding alphabet is generated from the set of probability values $p_i^1$, $i=1$, $2, \ldots, M_1$. A Huffman code tree may be generated in a first step using the Huffman algorithm. The Huffman code tree is in general not unique because the labeling of the branches at internal nodes in the Huffman tree is in general not uniquely specified. For example, if a binary Huffman tree has S internal nodes, there are $2^S$ possible Huffman trees. Many Huffman codes may then be associated to each Huffman tree. Therefore, the Huffman code generated by the Huffman algorithm is in general not uniquely specified. The entropy corresponds to the average codeword length of a Huffman alphabet of symbols where K words are merged or map to each symbol.

FIGS. 8a and 8b illustrate an example of the ACL function 12, which shows in the Y axis the entropy, calculated according to equations (2) and (3) above for different values of the $\log_2$ of the number of merged words (K). For instance, the arrow 30 in FIG. 8a points to a value of 128 merged words for each symbol, which provides an average codeword length of between 13.1 and 13.2, which is less than the number of bits (b) of the words. FIG. 8b provides an expanded view of FIG. 8a, and also shows a line 32 comprising an average codeword length for Huffman codes having symbols mapping to 32, 64, 128, 256 words (K). This curve in FIG. 8b is a function which is obtained as follows. For each K (x value), a new distribution is generated from the distribution of frequencies, as shown in FIG. 7, by merging K consecutive relative displacement values into one. The ACL (y value) is computed associated with this new distribution. For each point in FIG. 8b, K words in the word-frequency distribution 10 are merged, and then a first code alphabet frequency distribution 14 is calculated and a corresponding Huffman code (there are many Huffman codes but they all have the same ACL) is constructed. The ACL of the corresponding Huffman code is then computed. In FIG. 8b this was done four times for K=32, K=64, K=128 and K=256, i.e., four new distributions and corresponding entropy values were computed.

After generating the ACL function 12, the code alphabet generator 8 receives (at block 106) selection of one of the numbers of merged words (K) based on the generated ACL function 12. A user may select K as a trade-off of having to maximize the number of merged words (K) and minimize the average codeword length. The tradeoff occurs because decreases in the number of merged words decreases the ACL, so the selection of K is based on a trade-off of high compression ratio, which requires a smaller ACL, and the implementation of the number of merged words K, where a greater number of merged words is desired, but a greater number of merged words has the undesired effect of increasing the ACL. Alternatively, the code alphabet symbol generator 8 may use a program to determine a number of words to merge as part of the trade-off of the average codeword length and the number of merged words, to reduce the number of symbols generated for the alphabet.

The code alphabet generator 8 then generates (at block 108) a first code alphabet frequency distribution 14 of frequencies or probabilities for symbols that will map to groups of K consecutive words. The frequency/probability of each group of K consecutive words, which will map to a symbol, comprises a sum of the frequencies/probabilities of the K words in the group according to the word frequency distribution 10. In certain embodiments, the first code alphabet frequency distribution 14 may comprise pairs of $(i, f_i^1)$, where $i=1, 2 \ldots M1$, where M1=N/K, for each of the i symbols for the first code alphabet 18. The probabilities for the first code alphabet frequency distribution 14 may be calculated according to equation (3) above.

Figures 9A, 9B:
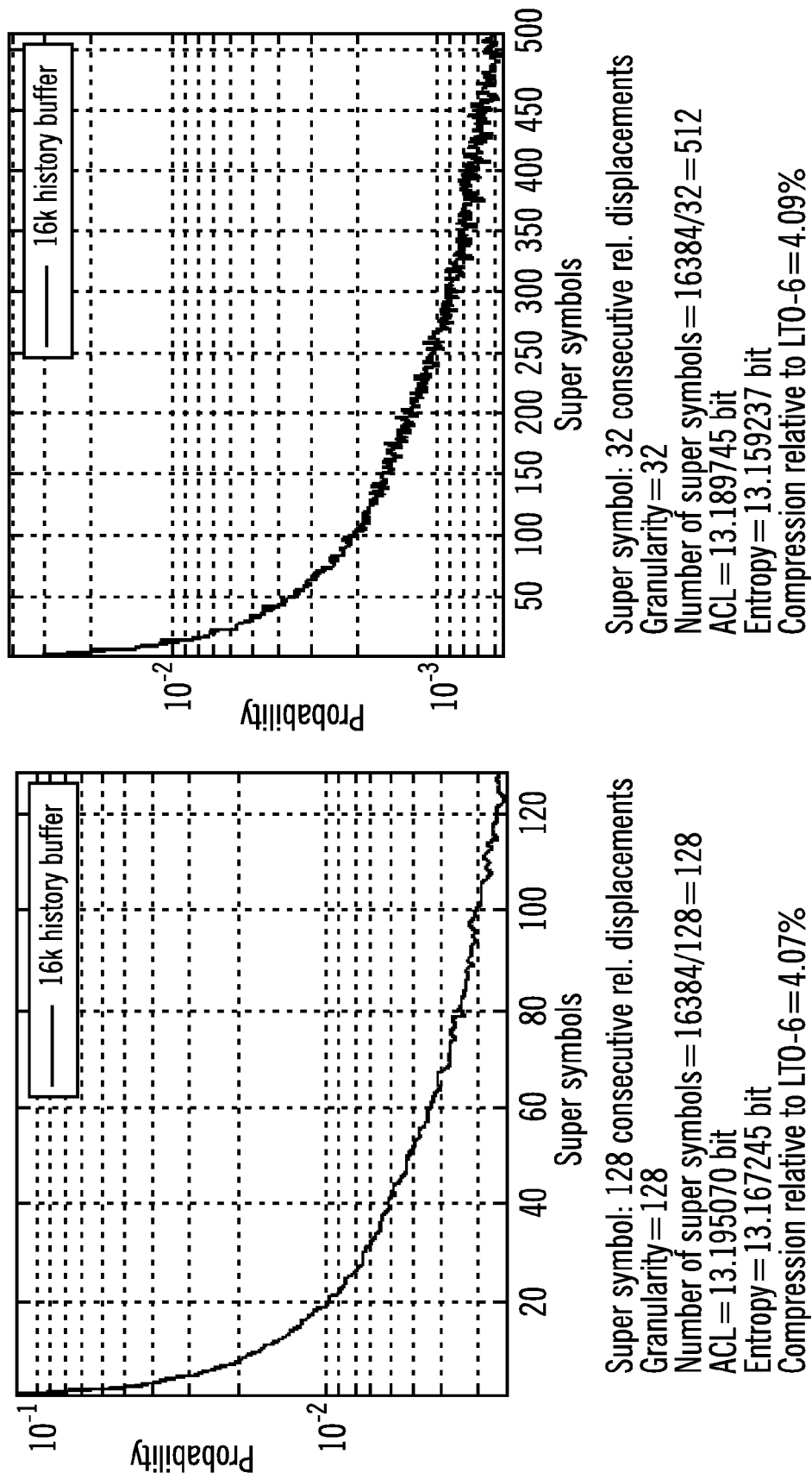
FIGS. 9a and 9b illustrate a probability distribution of the occurrence of words for symbols selecting 128 values and 32 values, respectively, to merge.

FIGS. 9a and 9b illustrate examples of the first code alphabet frequency distribution 14 for values of K (merged words) of 128 in FIG. 9a and 32 in FIG. 9b. These probabilities in these distributions are used to generate a Huffman alphabet for the first code alphabet 18 that provides an average codeword length less than the length of the words (b) being compressed. For instance, FIG. 9a, shows that for K=128, the Huffman encoding has an average codeword length (ACL) of 13.195070 and FIG. 9b shows that for K=32, the Huffman encoding has an ACL of 13.189745.

The code alphabet generator 8 then generates (at block 110) a first code alphabet 18 having a first number of symbols (M1=N/K) with the symbol probabilities from the first code alphabet frequency distribution 14. In certain embodiments, such as Huffman codings generated from the distribution 14, the symbols provide variable length codings of the groups of words. Each symbol in the first code alphabet 18 maps to the words in one of the groups and has a frequency of the group of words to which the symbol maps. A first average codeword length of the codewords produced using the symbols in the first code alphabet is smaller than the codeword length (b) of the N displacement values to provide compression using the codewords.

To reduce the number of symbols in the first code alphabet 18, the code alphabet generator 8 merges (at block 112) the symbols in the first code alphabet 18 into a second number of groups (M2) of the symbols in the first code alphabet 18, where M2<M1. The code alphabet symbol generator 8 then generates (at block 114) a second code alphabet frequency distribution 16 of frequencies of the merged second number of groups (M2) of the symbols in the first code alphabet 18, wherein the frequency of each of the merged second number of groups comprises a sum of the frequencies of the words assigned to the first code alphabet 18 symbols merged into the group.

In one embodiment, the second code alphabet frequency distribution 16 may have sets of pairs $(i, f_i^2)$ where $i=1, 2, \ldots, M_2$, where the frequency $(f_i^2)$ of the symbols in the second code alphabet 20, corresponding to the grouped symbols of the first code alphabet 18, can be calculated according to equation (4) below:

$$f_i^2 = \sum_{j=g(i)-m_i+1}^{g(i)} \text{, and } g(i) = \sum_{k=1}^{i} m_k \tag{4}$$

The set of probability values $p_i^2$ for the grouped symbols from the first code alphabet 18 that will map to symbols in the second code alphabet 20 may be calculated according to equation (5) below:

$$p_i^2 = \frac{f_i^2}{F} \tag{5}$$

The code alphabet generator 8 generates (at block 116) a second code alphabet 20 having the second number (M2) of symbols defined by the second code alphabet frequency distribution 16, wherein each symbol in the second code alphabet 20 maps to the words in one of the second number of groups and has a frequency or probability of the group of words to which the symbol maps. A second average codeword length of the codewords produced using the symbols in the second code alphabet 20 is preferably smaller than the codeword length (b) of the N displacement values and substantially similar to the first average codeword length produced by the first code alphabet 18.

With the operations of FIGS. 4a and 4b, the second code alphabet 20 is generated to have fewer symbols than the first code alphabet 18, providing a more desirable alphabet because it requires fewer rows to implement in the program 22. In certain embodiments, the average codeword length of the second code alphabet 20 is the same length as the average codeword length of the first code alphabet 18, to provide a more efficient set of fewer symbols with the same compression, entropy and or average codeword length. FIG. 10 illustrates an example of a Huffman second code alphabet 20 providing symbols in the form of Huffman codes for relative displacement values in a history buffer.

FIG. 5 illustrates an embodiment of operations to perform the merging of symbols at step 112 in FIG. 4a by merging symbols from the first code alphabet 18 into groups that produce symbols of equal length. Upon initiating (at block 120) the operation to merge symbols in the second number of groups (M2), the code alphabet generator 8 forms (at block 122) at least one group of $2^n$ consecutive code alphabet symbols of equal length, where n for each group of $2^n$ consecutive code alphabet symbols of one length is any non-negative integer value. Equal length symbols are merged by forming groups of $2^n$ symbols for the lowest possible values of n possible such that the symbols are assigned to different $2^n$ number of symbols.

Figure 11:
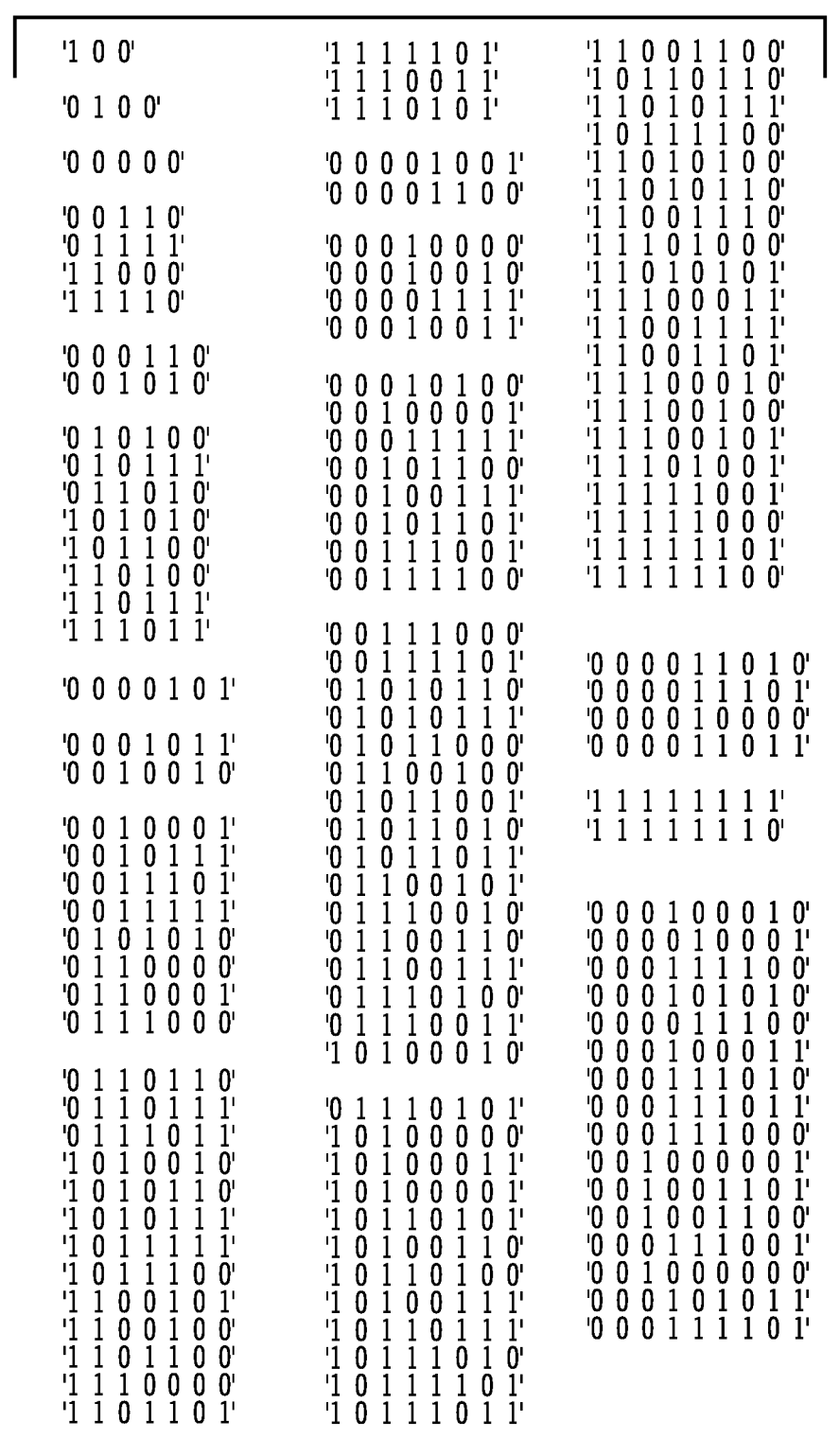

FIG. 11 illustrates an example of a first code alphabet 18 produced using Huffman encoding by the code alphabet generator 8 for relative displacement values into a history buffer having a length (b) of 14, where K is set to 128 to merge 128 of the words (relative displacement values) to produce a Huffman coding of the first code alphabet 18. Each of the 128 symbols in FIG. 11 would map to 128 ($2^{14}/128$) different of the possible replacement values. The 128 symbols map to consecutive relative displacement values, where the symbols having a shortest length map to consecutive relative displacement values, i.e., words, having a higher probability of being used/selected by the program 22. In this way, shorter symbols map to more frequently occurring words and longer symbols map to less frequently occurring words.

Figure 12:
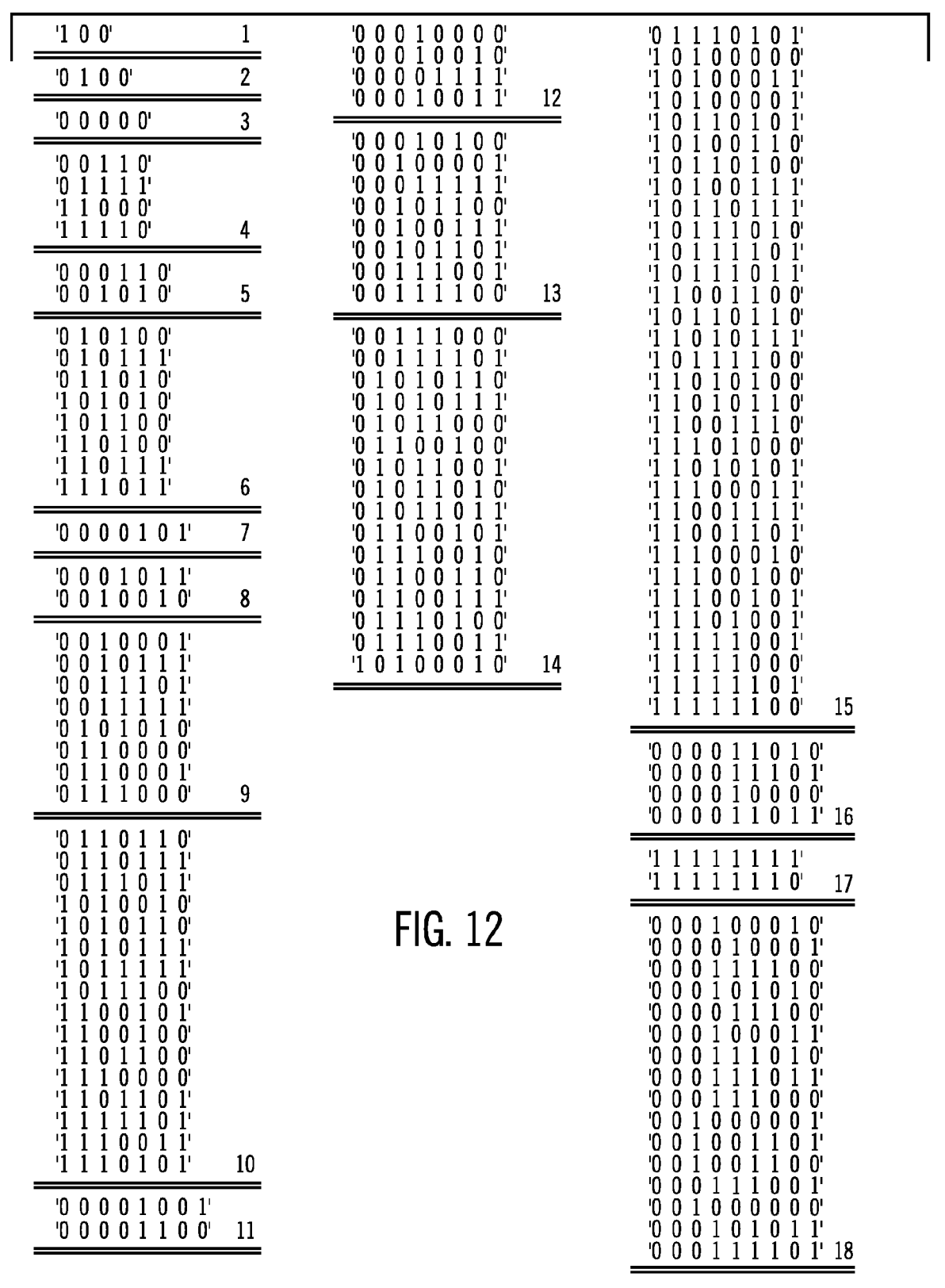

FIG. 12 illustrates an example of how the symbols in FIG. 11 are merged at block 122 in FIG. 5 into groups of $2^n$ equal length symbols, where n is any non-negative integer. The code alphabet generator 8 starts at the lowest possible value of n to start forming groups of $2^n$ merged consecutive symbols, where the consecutive symbols map to words that are ordered according to the probability of their occurrence when used by the program 22, such as a compression program. Thus, the groups of merged consecutive symbols of a same length have an increasing number of merged symbols as n increases for the symbols of equal length merged into groups. From the merged groups of symbols, 18 in all, a Huffman second code alphabet 20 is generated to generate 18 symbols, one symbol for each group, such that each symbol maps to the words (e.g., relative displacement values) to which the symbols merged in the group for which the symbol is generated. In this way, the second code alphabet 20 formed by merging symbols from the first code alphabet 18 substantially maintains the same average codeword length, with less symbols, thus providing an improved implementation of the code alphabet.

FIG. 6 illustrates an alternative embodiment for merging symbols from the first code alphabet 18 into fewer groups by grouping symbols of different length performed at block 112 in FIG. 4a. Upon initiating (at block 130) the operation to merge symbols in the second number of groups (M2), the code alphabet generator 8 forms (at block 132) each group to have consecutive symbols in the first code alphabet 18, wherein at least one of groups of symbols from the first code alphabet comprises at least two of the consecutive symbols in the first code alphabet having a different length. Groups of $2^n$ symbols are formed, starting from 0 to a value until all the first code alphabet symbols are formed in groups of $2^n$ symbols.

In certain embodiments, symbols of unequal length may be merged such that an inhomogeneity measure is small. The inhomogeneity measure is defined according to equation (6):

$$\frac{1}{F} \sum_{i=1}^{M_3} \sum_{j=h(i)-n_i+1}^{h(i)} z(j) f_j^1 \tag{6}$$

where $z(j)=0$ if the symbol corresponding to $f_j^1$, from the first code alphabet 18, is among the symbols having the most frequent length in a partition i with $n_i$ code words, otherwise $z(j)=1$.

The value h(i) is calculated according to equation (7) below:

$$h(i) = \sum_{k=1}^{i} n_k \tag{7}$$

To form groups of symbols of unequal length, the code alphabet generator 8 identifies in each group of symbols the most frequent length associated with the symbols. If two or more lengths in a group have the largest frequency, select the largest length as the most frequent length in a group. The code alphabet generator 8 sums over all relative frequencies of all code words in a partition excluding the code words with the most frequent length to obtain the inhomogeneity of a group of symbols. The code alphabet generator 8 then sums over all inhomogeneities of all groups underlying the first code alphabet to obtain the inhomogeneity of the underlying first code alphabet 18, shown in FIG. 13.

FIG. 13 illustrates an example of a first code alphabet of 128 symbols, where the ordering of the symbols, ordered according to the probability or frequency of the occurrence of the words to which the symbols map includes symbols of unequal length between symbols of equal length. FIG. 14 illustrates an example of how the symbols in FIG. 13 are grouped to have groups of symbols of unequal length, such as in groups 11 and 12.

Described embodiments provide techniques to generate a code alphabet symbol by merging symbols from a first code alphabet to provide further reduction in the number of code alphabet symbols needed to use for the coding yet at the same time maintain the average code word length substantially the same.

CONCLUSION

The described operations may be implemented as a method, apparatus or computer program product using standard programming and/or engineering techniques to produce software, firmware, hardware, or any combination thereof. Accordingly, aspects of the embodiments may take the form of an entirely hardware embodiment, an entirely software embodiment (including firmware, resident software, microcode, etc.) or an embodiment combining software and hardware aspects that may all generally be referred to herein as a "circuit," "module" or "system." Furthermore, aspects of the embodiments may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 15:
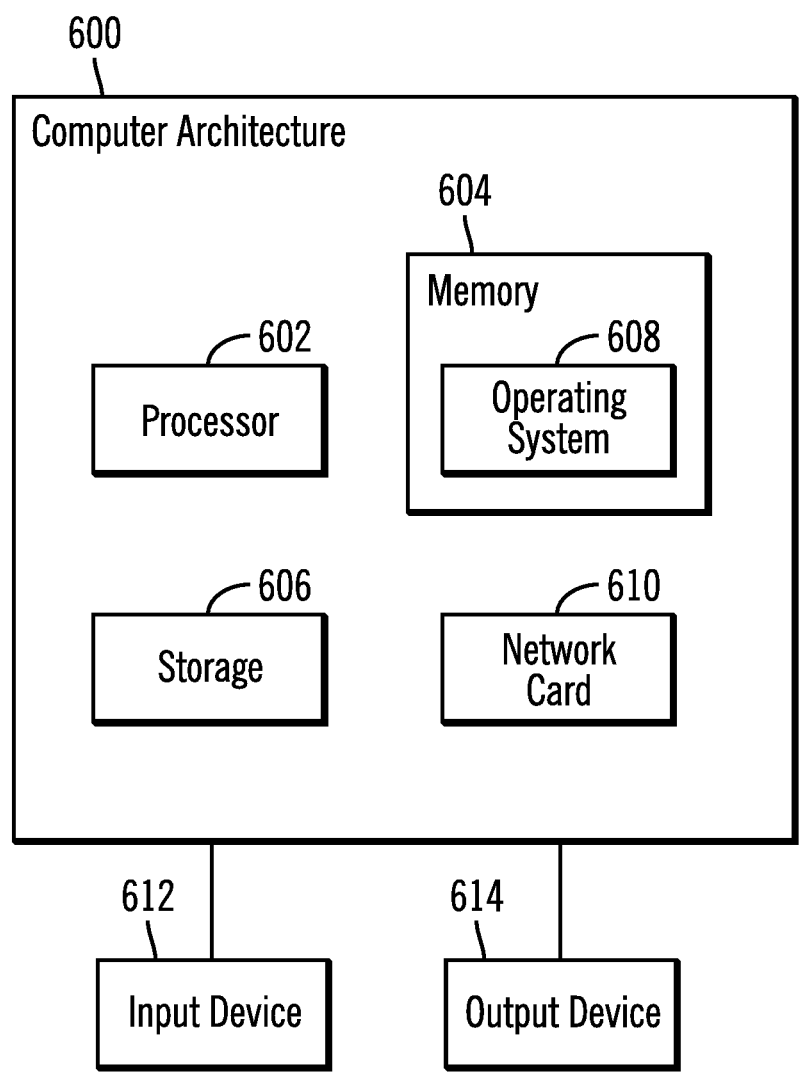
FIG. 15 illustrates a computer architecture in which described embodiments may be implemented.

FIG. 15 illustrates an embodiment of a computer architecture 600 that may be implemented at the system 2 in FIG. 1. The architecture 600 may include a processor 602 (e.g. a microprocessor), a memory 604 (e.g. a volatile memory device), and storage 606 (e.g. a non-volatile storage, such as magnetic disk drives, optical disk drives, a tape drive, etc.). The storage 606 may comprise an internal storage device or an attached or network accessible storage. Programs, including an operating system 608 and the code alphabet generator 8 and the deployed program 22 in the storage 606 are loaded into the memory 604 and executed by the processor 602. The memory 604 may further include the distributions 10, 14, 16, function 12, and alphabets 18 and 20. The architecture further includes a network card 610 to enable communication with a network. An input device 612 is used to provide user input to the processor 602, and may include a keyboard, mouse, pen-stylus, microphone, touch sensitive display screen, or any other activation or input mechanism known in the art. An output device 614 is capable of rendering information transmitted from the processor 602, or other component, such as a display monitor, printer, storage, etc.

The terms "an embodiment", "embodiment", "embodiments", "the embodiment", "the embodiments", "one or more embodiments", "some embodiments", and "one embodiment" mean "one or more (but not all) embodiments of the present invention(s)" unless expressly specified otherwise.

The terms "including", "comprising", "having" and variations thereof mean "including but not limited to", unless expressly specified otherwise.

The enumerated listing of items does not imply that any or all of the items are mutually exclusive, unless expressly specified otherwise.

The terms "a", "an" and "the" mean "one or more", unless expressly specified otherwise.

Devices that are in communication with each other need not be in continuous communication with each other, unless expressly specified otherwise. In addition, devices that are in communication with each other may communicate directly or indirectly through one or more intermediaries.

A description of an embodiment with several components in communication with each other does not imply that all such components are required. On the contrary a variety of optional components are described to illustrate the wide variety of possible embodiments of the present invention.

Further, although process steps, method steps, algorithms or the like may be described in a sequential order, such processes, methods and algorithms may be configured to work in alternate orders. In other words, any sequence or order of steps that may be described does not necessarily indicate a requirement that the steps be performed in that order. The steps of processes described herein may be performed in any order practical. Further, some steps may be performed simultaneously.

When a single device or article is described herein, it will be readily apparent that more than one device/article (whether or not they cooperate) may be used in place of a single device/article. Similarly, where more than one device or article is described herein (whether or not they cooperate), it will be readily apparent that a single device/article may be used in place of the more than one device or article or a different number of devices/articles may be used instead of the shown number of devices or programs. The functionality and/or the features of a device may be alternatively embodied by one or more other devices which are not explicitly described as having such functionality/features. Thus, other embodiments of the present invention need not include the device itself.

The illustrated operations of FIGS. 4a, 4b, 5, and 6 show certain events occurring in a certain order. In alternative embodiments, certain operations may be performed in a different order, modified or removed. Moreover, steps may be added to the above described logic and still conform to the described embodiments. Further, operations described herein may occur sequentially or certain operations may be processed in parallel. Yet further, operations may be performed by a single processing unit or by distributed processing units.

The foregoing description of various embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto. The above specification, examples and data provide a complete description of the manufacture and use of the composition of the invention. Since many embodiments of the invention can be made without departing from the spirit and scope of the invention, the invention resides in the claims herein after appended.

What is claimed is:

1. A computer program product for generating a code alphabet for use by a deployed program to determine codewords for words having a length of b bits used in a computing system, wherein the codewords have an average codeword length less than b, the computer program product comprising a computer readable storage medium having computer readable program code embodied therein that executes to perform operations, the operations comprising:
   generating a first code alphabet having a first number of symbols that provide variable length codings of the words, wherein a first average codeword length of the codewords produced using the symbols in the first code alphabet is smaller than the codeword length (b) of the words;
   merging the symbols in the first code alphabet into a second number of groups of the symbols in the first code alphabet, where the second number is less than the first number; and
   generating a second code alphabet having the second number of symbols, wherein a second average codeword length of the codewords produced using the symbols in the second code alphabet is smaller than the codeword length (b) of the words, and wherein the second code alphabet comprises the code alphabet used by the deployed program.

2. The computer program product of claim 1, wherein the operations further comprise:
   generating a word frequency distribution of frequencies of occurrences of all possible $2^b$ words (N);
   computing an average codeword length (ACL) function that assigns ACL values to different numbers of groups of merged words (K) based on the word frequency distribution; and
   receiving selection of one of the numbers of merged words (K) based on the ACL function, wherein the first number of symbols comprises K, wherein each symbol maps to a group of K of the N possible words.

3. The computer program product of claim 2, wherein the average codeword length for each number of merged words (K) is calculated based on a probability of occurrence of each alphabet code symbol representing the K number of codewords based on the word frequency distribution.

4. The computer program product of claim 2, wherein in the word frequency distribution of frequencies of occurrences of the N possible words, words having a smaller length in bits are more frequently accessed than words having a larger length of bits.

5. The computer program product of claim 1, wherein the first average codeword length equals the second average codeword length and wherein the first code alphabet and the second code alphabet are calculated using a Huffman coding algorithm.

6. The computer program product of claim 1, wherein merging the symbols in the first code alphabet into the second number of groups comprises forming each group to have symbols in the first code alphabet of an equal length.

7. The computer program product of claim 6, wherein merging the symbols of the first code alphabet into the second number of groups comprises forming at least one group of $2^n$ consecutive code alphabet symbols of equal length, where n for each group of $2^n$ consecutive code alphabet symbols of one length is any non-negative integer value.

8. The computer program product of claim 1, wherein the operations further comprise:
   generating a first code distribution of frequencies of groups of words each having the selected K number of words of the N words, wherein the frequency of each of the groups comprises a sum of the frequencies of the K words included in the group according to the word frequency distribution, wherein the symbols in the first code alphabet are constructed from the first code distribution, and wherein each symbol in the first code alphabet maps to the words in one of the groups and has a frequency of the group of words to which the symbol maps.

9. The computer program product of claim 1, wherein the operations further comprise:
   generating a second code distribution of frequencies of the merged second number of groups of the symbols in the first code alphabet, wherein the frequency of each of the merged second number of groups comprises a sum of the frequencies of the words assigned to the first code alphabet symbols merged into the group, wherein the second code alphabet is constructed from the second code distribution, and wherein each symbol in the second code alphabet maps to the words in one of the second number of groups and has a frequency of the group of words to which the symbol maps.

10. The computer program product of claim 1, wherein merging the symbols in the first code alphabet into the second number of groups comprises forming each group to have consecutive symbols in the first code alphabet, wherein at least one of groups of symbols from the first code alphabet comprises at least two of the consecutive symbols in the first code alphabet having a different length.

11. The computer program product of claim 1, wherein the selection of K is received via a person from a computer user interface.

12. The computer program product of claim 1, wherein an optimization routine selects K to minimize the average codeword length and maximize the selected number of merged words (K).

13. The computer program product of claim 1, wherein the words comprise different displacement count values for a history buffer used to compress data, wherein each of the displacement count values indicates a location in the history buffer where a plurality of words begins that matches a plurality of words in an input data stream to compress, wherein the code alphabet is used to determine a codeword for the displacement count value that is included in a copy pointer to represent the location in the history buffer having the plurality of words in the input data stream, and further comprising:
   deploying the second code alphabet in a compression program that uses the symbols to determine codewords for the displacement count values in the history buffer.

14. A system for generating a code alphabet for use by a deployed program to determine codewords for words having a length of b bits used in a computing system, wherein the codewords have an average codeword length less than b, comprising:
   a processor; and
   a computer readable storage medium having computer readable program executed by the processor to perform operations, the operations comprising:
      generating a first code alphabet having a first number of symbols that provide variable length codings of the words, wherein a first average codeword length of the codewords produced using the symbols in the first code alphabet is smaller than the codeword length (b) of the words;
      merging the symbols in the first code alphabet into a second number of groups of the symbols in the first code alphabet, where the second number is less than the first number; and
      generating a second code alphabet having the second number of symbols, wherein a second average codeword length of the codewords produced using the symbols in the second code alphabet is smaller than the codeword length (b) of the words, and wherein the second code alphabet comprises the code alphabet used by the deployed program.

15. The system of claim 14, wherein the operations further comprise:
   generating a word frequency distribution of frequencies of occurrences of all possible $2^b$ words (N);
   computing an average codeword length (ACL) function that assigns ACL values to different numbers of groups of merged words (K) based on the word frequency distribution; and
   receiving selection of one of the numbers of merged words (K) based on the ACL function, wherein the first number of symbols comprises K, wherein each symbol maps to a group of K of the N possible words.

16. The system of claim 15, wherein in the word frequency distribution of frequencies of occurrences of the N possible words, words having a smaller length in bits are more frequently accessed than words having a larger length of bits.

17. The system of claim 14, wherein the first average codeword length equals the second average codeword length and wherein the first code alphabet and the second code alphabet are calculated using a Huffman coding algorithm.

18. The system of claim 14, wherein merging the symbols in the first code alphabet into the second number of groups comprises forming each group to have symbols in the first code alphabet of an equal length.

19. The system of claim 14, wherein merging the symbols in the first code alphabet into the second number of groups comprises forming each group to have consecutive symbols in the first code alphabet, wherein at least one of groups of symbols from the first code alphabet comprises at least two of the consecutive symbols in the first code alphabet having a different length.

20. The system of claim 14, wherein the words comprise different displacement count values for a history buffer used to compress data, wherein each of the displacement count values indicates a location in the history buffer where a plurality of words begins that matches a plurality of words in an input data stream to compress, wherein the code alphabet is used to determine a codeword for the displacement count value that is included in a copy pointer to represent the location in the history buffer having the plurality of words in the input data stream, and further comprising:
   deploying the second code alphabet in a compression program that uses the symbols to determine codewords for the displacement count values in the history buffer.

21. A method for generating a code alphabet for use by a deployed program to determine codewords for words having a length of b bits used in a computing system, wherein the codewords have an average codeword length less than b, comprising:

generating a first code alphabet having a first number of symbols that provide variable length codings of the words, wherein a first average codeword length of the codewords produced using the symbols in the first code alphabet is smaller than the codeword length (b) of the words;

merging the symbols in the first code alphabet into a second number of groups of the symbols in the first code alphabet, where the second number is less than the first number; and generating a second code alphabet having the second number of symbols, wherein a second average codeword length of the codewords produced using the symbols in the second code alphabet is smaller than the codeword length (b) of the words, and wherein the second code alphabet comprises the code alphabet used by the deployed program.

22. The method of claim 21, further comprising:

generating a word frequency distribution of frequencies of occurrences of all possible $2^b$ words (N);

computing an average codeword length (ACL) function that assigns ACL values to different numbers of groups of merged words (K) based on the word frequency distribution; and receiving selection of one of the numbers of merged words (K) based on the ACL function, wherein the first number of symbols comprises K, wherein each symbol maps to a group of K of the N possible words.

23. The method of claim 22, wherein in the word frequency distribution of frequencies of occurrences of the N possible words, words having a smaller length in bits are more frequently accessed than words having a larger length of bits.

24. The method of claim 21, wherein the first average codeword length equals the second average codeword length and wherein the first code alphabet and the second code alphabet are calculated using a Huffman coding algorithm.

25. The method of claim 21, wherein merging the symbols in the first code alphabet into the second number of groups comprises forming each group to have symbols in the first code alphabet of an equal length.

26. The method of claim 21, wherein merging the symbols in the first code alphabet into the second number of groups comprises forming each group to have consecutive symbols in the first code alphabet, wherein at least one of groups of symbols from the first code alphabet comprises at least two of the consecutive symbols in the first code alphabet having a different length.

27. The method of claim 21, wherein the words comprise different displacement count values for a history buffer used to compress data, wherein each of the displacement count values indicates a location in the history buffer where a plurality of words begins that matches a plurality of words in an input data stream to compress, wherein the code alphabet is used to determine a codeword for the displacement count value that is included in a copy pointer to represent the location in the history buffer having the plurality of words in the input data stream, and further comprising:

deploying the second code alphabet in a compression program that uses the symbols to determine codewords for the displacement count values in the history buffer.

* * * * *